United States Patent [19]
Lin et al.

[11] Patent Number: 5,553,711
[45] Date of Patent: Sep. 10, 1996

[54] STORAGE CONTAINER FOR INTEGRATED CIRCUIT SEMICONDUCTOR WAFERS

[75] Inventors: Chih-Ching Lin; Jin-Chys Tai, both of Hsin-Chu, Taiwan

[73] Assignee: Taiwan Semiconductor Manufacturing Company, Hsinchu, Taiwan

[21] Appl. No.: 498,662

[22] Filed: Jul. 3, 1995

[51] Int. Cl.⁶ ..................................... B65D 85/30
[52] U.S. Cl. .......................... 206/710; 206/454; 206/303
[58] Field of Search .................... 206/710–712, 206/523, 303, 328, 453–456; 118/500

[56] References Cited

U.S. PATENT DOCUMENTS 4,787,508  11/1988  Wu et al. ................. 206/445
4,886,162  12/1989  Ambrogio ................. 206/455
5,366,079  11/1994  Lin et al. ................. 206/328
5,454,468  10/1995  Chou et al. ................. 206/710

*Primary Examiner*—Paul T. Sewell
*Assistant Examiner*—Luan K. Bui
*Attorney, Agent, or Firm*—George O. Saile; Wolmar J. Stoffel

[57] ABSTRACT

A wafer container having an enclosure member and a body member. The body member having a base, a plurality of spaced arcuate members on the base adapted to encircle wafers stacked on the base. A layer of resilient material on the insides of the arcuate members. A retainer member with flaps positioned between the arcuate members on the top of a stack of wafers.

5 Claims, 3 Drawing Sheets

5,553,711

STORAGE CONTAINER FOR INTEGRATED CIRCUIT SEMICONDUCTOR WAFERS

BACKGROUND OF THE INVENTION (1) Field of the Invention

The present invention relates generally to semiconductor wafer handing, and more particularly to an improved wafer container that provides increased protection of wafers stored therein.

(2) Description of the Prior Art

The transport and storage of semiconductor wafers has presented more problems as the diameter of wafers has increased in size, and the circuitry has become more microminiaturized. A container for storing and transporting IC wafers is described in U.S. Pat. No. 4,787,508. While the disclosed container is a major improvement over other known containers, in certain situations, damage can still occur. The most vulnerable wafers were those that do not have a top surface passivation layer. Any movement of the wafers within the container could potentially damage the very fragile metallurgy pattern on the surface of the wafer.

Another container for semiconductor wafers is described in U.S. Pat. No. 5,366,079 to Lin et al, "Integrated Circuit Wafer And Retainer Element Combination". The described container includes a base member provided with spaced upright arcuate members, cover and a flexible retainer member that interacts with the arcuate members. This container provides a very large improvement over the existing prior art containers in providing protection for the wafers against shock and vibration. However, as the thicknesses of the wafers used by the industry become thinner, the need for additional protection becomes greater.

SUMMARY OF THE INVENTION

It is an object of the invention to provide an improvement in the handling and storage of IC wafers.

A further object of the invention is to provide a novel wafer container that provides additional protection for wafers stored therein, particularly shock delivered to the containers in a direction transverse to the longitudinal axis of the container.

Yet another object of the invention is to provide a container for semiconductor wafers that provides shock protection for wafers stored therein that is directed in the direction of the plane of the wafer.

In accordance with the aforementioned objectives, there is provided an improved container for storing stacked semiconductor wafers. The container has an enclosure member, a body member, and a retainer element. The body member has a base with a plurality of arcuate, longitudinally directed members supported on the base and adapted to encircle wafers stacked on the base. The arcuate members are spaced from each other by longitudinal slots. A layer of firm, foamed material is provided on the inside surfaces of the arcuate members. A flexible retainer element having a plurality of flexible radially extending flaps that interact with the slots stabilizes the wafers in the longitudinal direction. The foam material stabilizes the wafers in the transverse direction.

DESCRIPTION OF THE PREFERRED EMBODIMENTS

Figure 1:
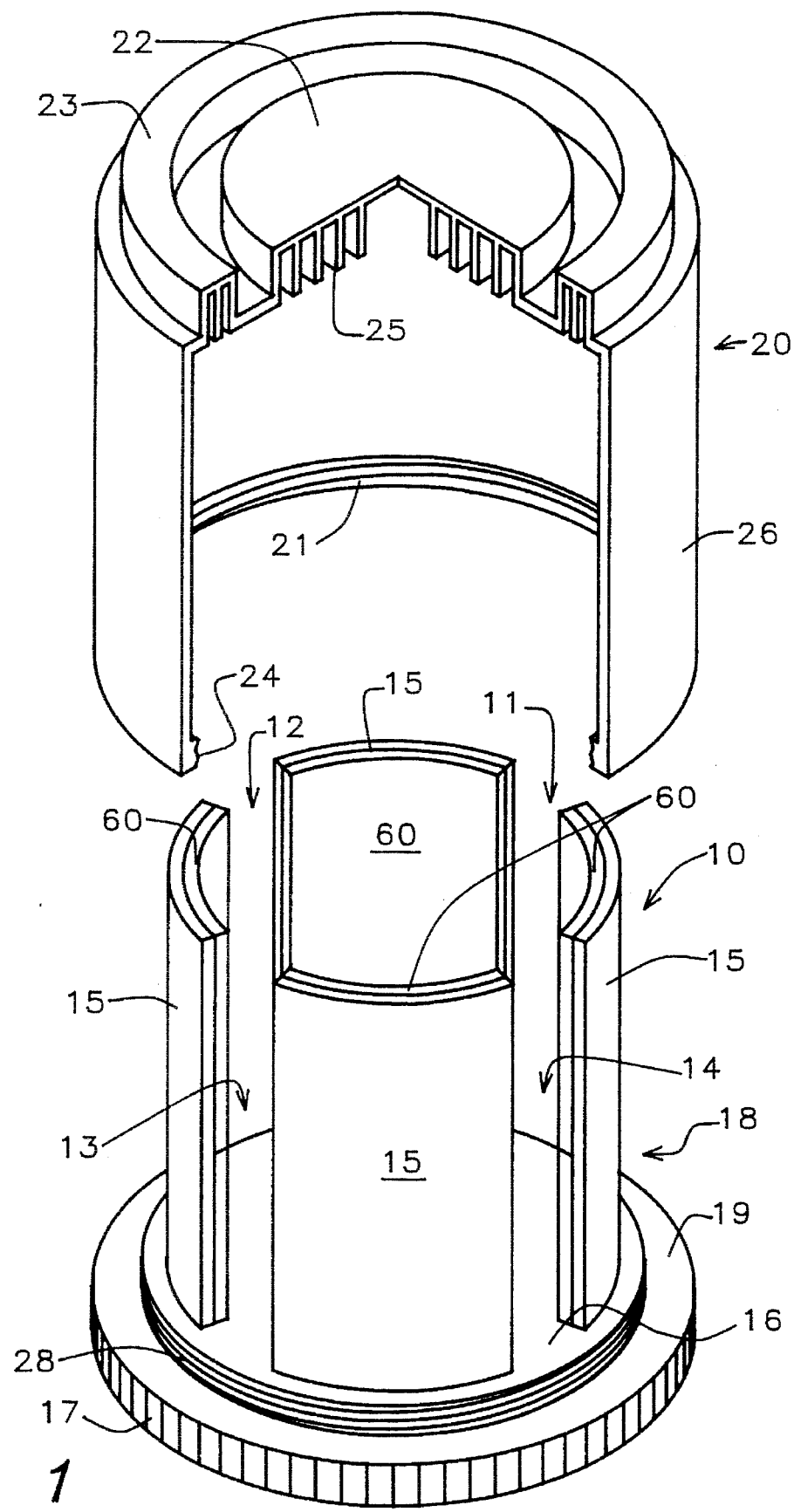
FIG. 1 is a perspective view of the wafer container element of the invention in exploded relation.

Referring now to the drawings, FIG. 1 shows a preferred embodiment of the wafer container element of the invention. The container is comprised of two parts, i.e. an enclosure member 20 and a body member 10. The body member 10 is formed of a hollow cylindrical body 18, a circular base 16, and a circular flange 17 having a larger diameter than that of base 16. The base 16 has a plurality of screw threads around the circumference thereof. Cylindrical body 18 is made up of a plurality of arcuate longitudinally directed members 15 supported on base 16, which are adapted to encircle semiconductor wafers stacked on the base, as more clearly shown in FIG. 2. Arcuate members 15 are spaced from each other to form slots 11, 12, 13 and 14.

Figure 2:
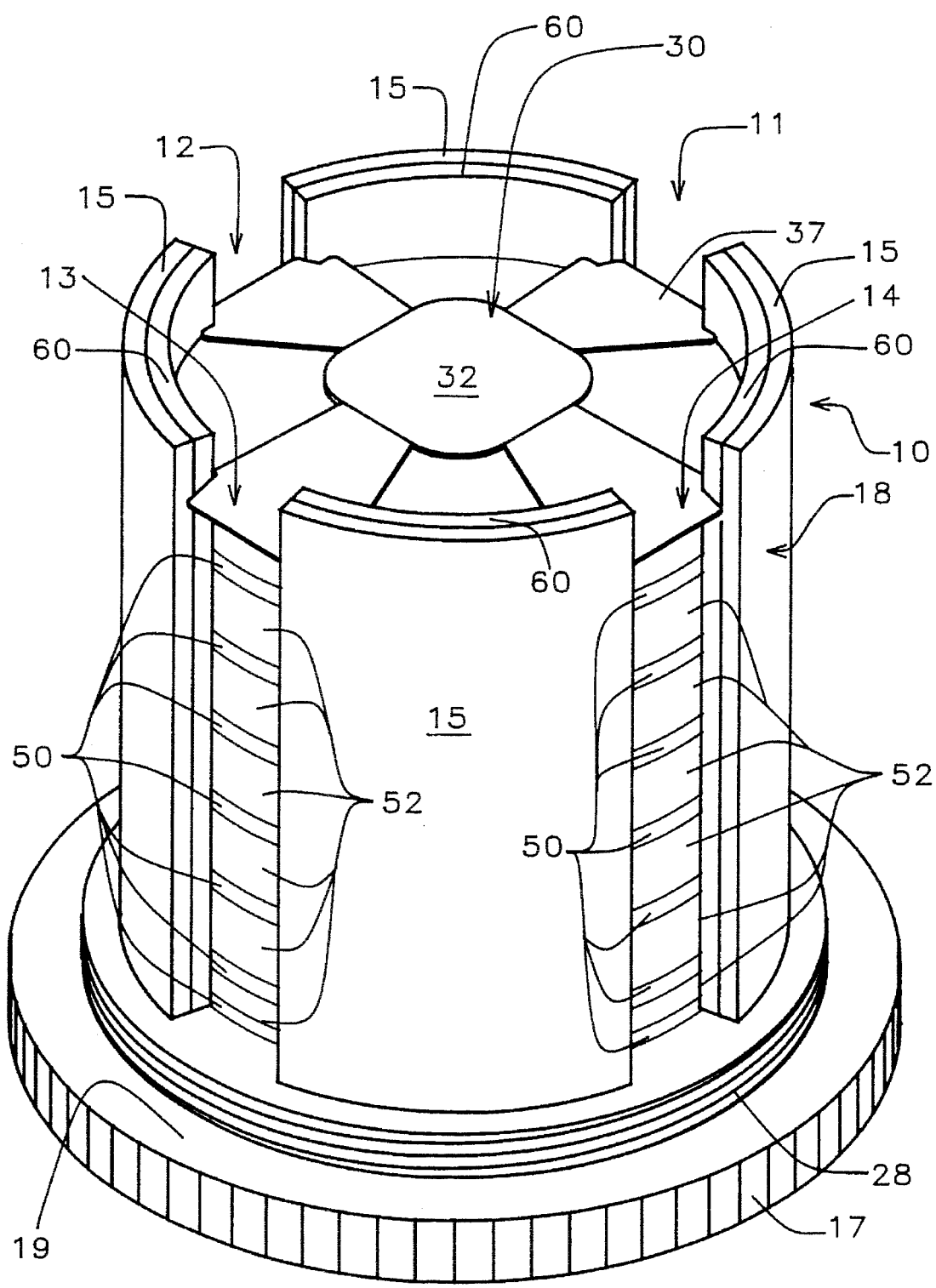
FIG. 2 is a perspective view of the body member of the wafer container, shown with a plurality of semiconductor wafers stored within, and with the retainer element mounted in position over the wafers.

On the inside surfaces of each of the arcuate members 15 is adhered a thin layer of resilient material 60, preferably a layer of firm foamed material. Layer 60 is positioned between the arcuate members 15 and the semiconductor wafers 50, as shown in FIG. 2. Layer 60 protects wafers 50 when a transversely directed shock is imparted to wafers 50 by preventing direct contact between the wafer edges and the arcuate members 15. Protection of the wafers 50 is very important, particularly when the thickness of the wafers is reduced. Wafers that are typically stored in the wafer container have a diameter on the order of 150 mm and a thickness on the order of 250–525 um. However, the container is adapted to store any size wafer when it is designed to accept the wafer size.

The layer of resilient material 60 has a thickness in the range of 2 to 3 millimeters, and a resiliency that is firm enough to prevent the wafers 50 from striking or contacting members 15. Preferably layer 60 is formed of a cellular or foamed material that can be organic material or other inorganic material. Another requirement for layer 60 is that it be antistatic to protect the circuitry on the wafers 50. In order to be antistatic, the conductivity of the layer 60 must be in the range of $10^9$ to $10^{13}$ ohm/square. Layer 60 is preferably of a static dissipative that is also soft yet firm. A preferred material is plastic sponge.

The enclosure member 20 has a top circular wall joined to a cylindrically shaped wall 26, that is adapted to encompass and enclose the cylindrical body 18, i.e. arcuate members of body member 10. Threaded portion 21 interfit with threaded portion 28 on base 16 to secure the body member 10 and enclosure member 20 in sealed relationship. The lower annular end surface 24 of enclosure member abuts surface 19 on body member 10. Annular recess 23 on enclosure member 20 is adapted to interfit with a circular recess in flange 17 on base 16, (not shown) to permit vertical stacking of the containers. Protuberance 25 strengthen the wall 22 and are used to press the retainer element 30 against wafers stacked in body member 10.

Figure 3:
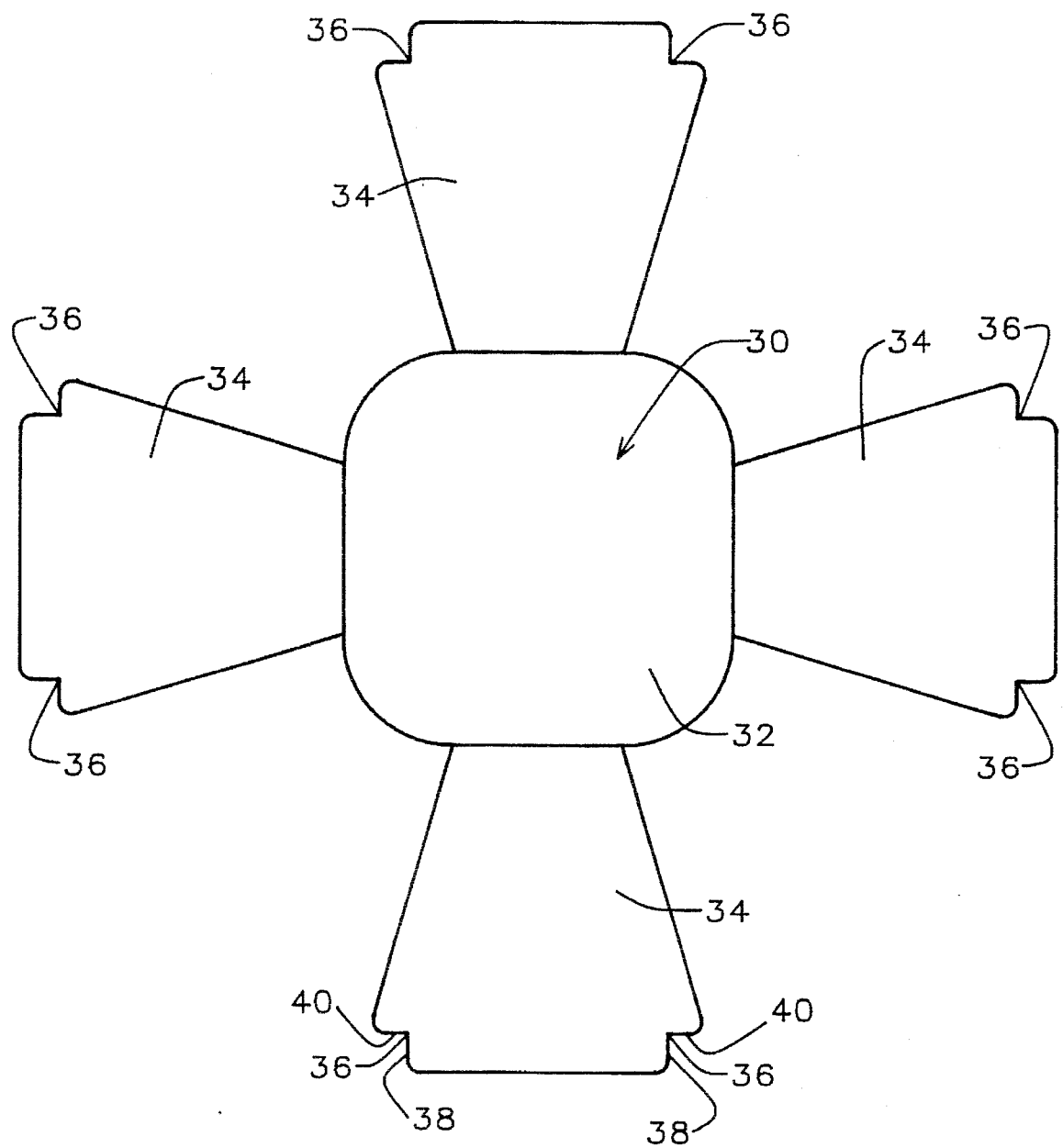
FIG. 3 is a top plan view of the retainer element of the invention.
Figure 4:
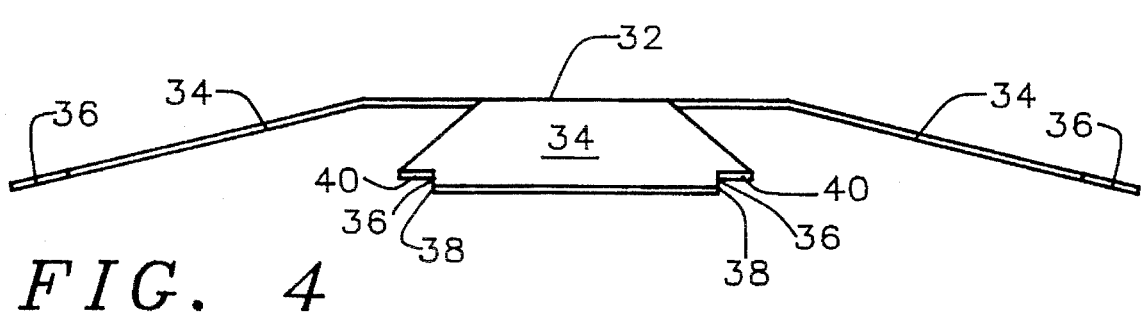
FIG. 4 is a side view of the retainer embodiment depicted in FIG. 3.

Referring now to FIG. 3, there is illustrated the retainer element 30 of a flat central portion 32 and a plurality of flexible radially extending flaps 34 depending from portion 32. The flaps 34 are downwards inclined from the plane of the flat central portion 32 as more clearly illustrated in FIG. 4. The inclination is in the range of about 11 to 13 degrees, more preferably of the order of about 12 degrees from the horizontal center plane 30. Alternatively, the flaps and central portion can be flat, that is substantially in the same plane, but this is not preferred. Each of flaps 34 are preferably provided with opposed notches 36 on the outer ends as most clearly shown in FIG. 3. The central portion and flaps are preferably of a uniform thickness, which is in the range of about 0.9 to 1.1 millimeters. In use, the surfaces 38 abut the side surfaces of arcuate walls 15 and fit in slots 11, 12, 13 and 14. The surfaces 40 assist in centering the retainer element 30 within the container. Retainer element 30 can be formed of any suitable material that provides the necessary flexibility. A preferred material is polypropylene. Other suitable materials are polyester, polyethylene, etc.

In use wafers are stacked in body member 10 as indicated in FIG. 2. Suitable soft circular cushion elements 52, of the same diameter as the wafers, are positioned between the wafers. Cushion elements 52 are formed of any suitable material, such as foam plastic, etc. A preferred material is static dissipative material, such as plastic sponge. Also positioned between the wafers are flexible discs of either electrically conductive material or static dissipative material. The preferred material is lint free paper.

In use the semiconductor wafers 50, the cushion elements 52, and the electrically conductive discs are stacked in body member 10 until the top surface of the stack is at the bottom surface of the enclosure member, when in place. The retainer element 30 is placed on the top of the stack and the enclosure member secured. The retainer member will maintain a uniform pressure on the stack and also prevent rotation of the wafers within the containers, since the flaps interfit with the slots of the body member.

EXAMPLE

In order to evaluate the effectiveness of the new structure, i.e. the modified wafer container embodying a resilient layer 60 on the arcuate members 15, it was tested against the wafer container described in U.S. Pat. No. 5,366,079. The containers are basically similar with the exception of the layer 60.

In the wafer container of the invention, a resilient layer of sponge material with a thickness of 2 millimeters, and a conductivity in the range of $10^9$ to $10^{13}$ ohm/square was provided on the arcuate members. The container of the patent did not have resilient layers on the arcuate members. Semiconductor wafers with a diameter of 150 mm and a thickness of 250 um, were stacked in the bases of both containers and separated by cushion elements 52 and electrically conductive disc. Both containers were subjected to the same vibration and shock, including transverse shock, that might be encountered in normal handling and shipping operations.

The test was repeated approximately 1,000 times to assure a good representative trial. At the end of each test, the wafers were carefully examined and the breakage noted and recorded. At the end of the tests, it was found that the broken rate was 0.01% in the wafer container with the resilient layers, and 0.1% in the wafer container without the resilient layer.

While the invention has been particularly shown and described with reference to the preferred embodiments thereof, it will be understood by those skilled in the art that various changes in form and details may be made without departing from the spirit and scope of the invention.

What is claimed is:

1. An integrated circuit wafer container comprising:

a wafer container having an enclosure member and a body member, said body member having a base, a plurality of arcuate, longitudinally directed members supported on said base and adapted to encircle wafers stacked on said base, said arcuate members spaced from each other by uniform width longitudinal slots, a layer of resilient material having a high electrical resistivity on the inside arcuate surface of each of said arcuate members that provides a cushioning action to wafers stacked on said base, said enclosure member having a top wall and a cylindrically shaped wall to encompass and enclose said plurality of arcuate members, and means to secure said body member and said enclosure member together, and a retainer element having a flat central portion, and a plurality of flexible radially extending flaps depending from said central portion, said flaps inclined downwardly from the plane of said flat central portion, each of said flaps having opposed notches in the outer end that provide parallel surfaces that engage said slots between arcuate members, and abutting surfaces that engage said layer of resilient material.

2. The wafer container of claim 1 wherein said layer of resilient material has a thickness in the range of 2 to 3 mm.

3. The wafer container of claim 2 wherein said layer of resilient material is foamed material.

4. The wafer container of claim 2 wherein said layer of resilient material is antistatic.

5. The wafer carrier of claim 4 wherein said layer of resilient material has a conductivity in the range of $10^9$ to $10^{13}$ ohm/square.

* * * * *